United States Patent [19]
Okada et al.

[11] Patent Number: 6,111,317
[45] Date of Patent: Aug. 29, 2000

[54] FLIP-CHIP CONNECTION TYPE SEMICONDUCTOR INTEGRATED CIRCUIT DEVICE

[75] Inventors: Takashi Okada; Naohiko Hirano, both of Kawasaki; Hiroshi Tazawa, Yokohama; Eiichi Hosomi, Kawasaki; Chiaki Takubo, Tokyo; Kazuhide Doi, Kawasaki; Yoichi Hiruta, Kashiwa; Koji Shibasaki, Kawasaki, all of Japan

[73] Assignee: Kabushiki Kaisha Toshiba, Kawasaki, Japan

[21] Appl. No.: 08/784,814

[22] Filed: Jan. 16, 1997

[30] Foreign Application Priority Data

Jan. 18, 1996 [JP] Japan .................................... 8-006659

[51] Int. Cl.⁷ .................... H01L 23/528; H01L 23/48; H01L 23/52; H01L 29/40
[52] U.S. Cl. ............... 257/737; 257/738; 257/784; 257/758; 257/700; 257/751; 257/762; 257/766; 257/772
[58] Field of Search ............... 257/734, 735, 257/737, 738, 723, 700, 7.58, 742, 746, 772, 777–781; 267/751, 784, 786

[56] References Cited

U.S. PATENT DOCUMENTS

| | | | |
|---|---|---|---|
| 5,046,161 | 9/1991 | Takada | 257/778 |
| 5,272,111 | 12/1993 | Kosaki | 204/192.25 |
| 5,394,013 | 2/1995 | Oku et al. | 257/758 |
| 5,448,114 | 9/1995 | Kondoh et al. | 257/737 |
| 5,604,379 | 2/1997 | Mori | 257/737 |
| 5,631,499 | 5/1997 | Hosomi et al. | 257/738 |
| 5,656,858 | 8/1997 | Kondo et al. | 257/737 |
| 5,677,576 | 10/1997 | Akagawa | 257/737 |
| 5,719,448 | 2/1998 | Ichikawa | 257/781 |
| 5,757,078 | 5/1998 | Matsuda et al. | 257/737 |
| 5,773,888 | 6/1998 | Hosomi et al. | 257/751 |
| 5,834,844 | 11/1998 | Akagawa et al. | 257/758 |
| 5,844,304 | 12/1998 | Kata et al. | 257/737 |
| 5,883,435 | 3/1999 | Geffken et al. | 257/737 |
| 5,886,415 | 3/1999 | Akagawa | 257/737 |
| 5,903,058 | 5/1999 | Akram | 257/737 |

FOREIGN PATENT DOCUMENTS

| | | | |
|---|---|---|---|
| 393220 | 10/1990 | European Pat. Off. | 257/737 |
| 53-68970 | 6/1978 | Japan | 257/738 |
| 58-200526 | 11/1983 | Japan | 257/738 |
| 62-35650 | 2/1987 | Japan | 257/738 |
| 63-31138 | 2/1988 | Japan . | |
| 1-128546 | 5/1989 | Japan | 257/737 |
| 8-203910 | 8/1996 | Japan . | |

Primary Examiner—Alexander O. Williams
Attorney, Agent, or Firm—Finnegan, Henderson, Farabow, Garrett & Dunner, L.L.P.

[57] ABSTRACT

A first insulating film is formed on an integrated circuit chip on which an I/O pad is formed. A first opening portion is formed above the I/O pad. A conductive layer and a barrier metal layer which are electrically connected to the I/O pad through the first opening portion are stacked on the first insulating film. The conductive layer and the barrier metal layer are patterned by a single mask. A second insulating film is formed on the resultant structure. A second opening portion is formed in the second insulating film at a position different from that of the first opening portion. A solder bump or metal pad is formed on the barrier metal layer in the second opening portion. The position of the solder bump or metal pad is defined by the second opening portion.

16 Claims, 7 Drawing Sheets

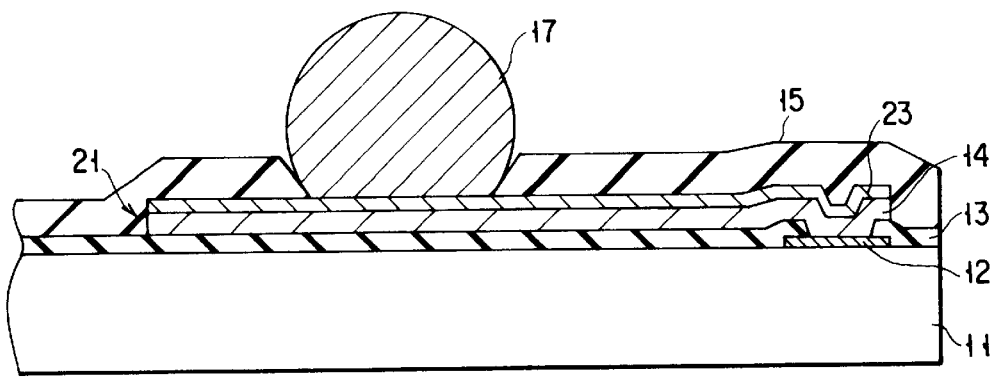
F I G. 6
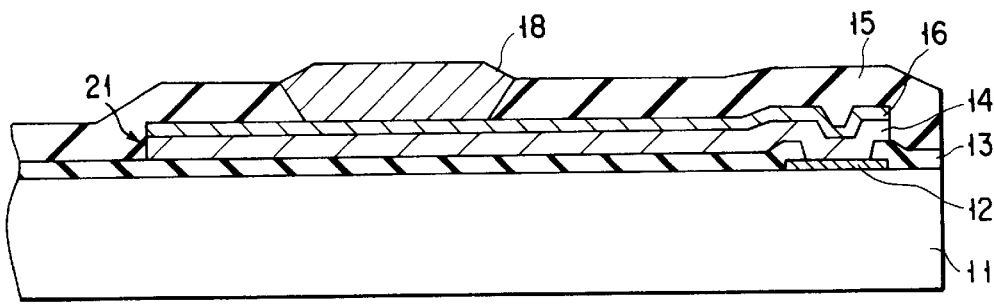
F I G. 7
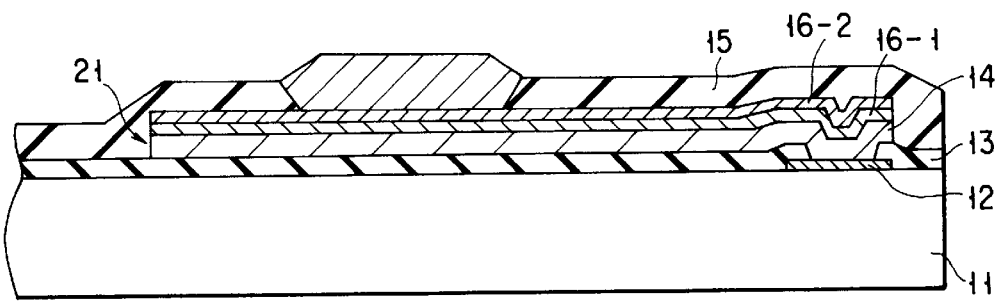
F I G. 8
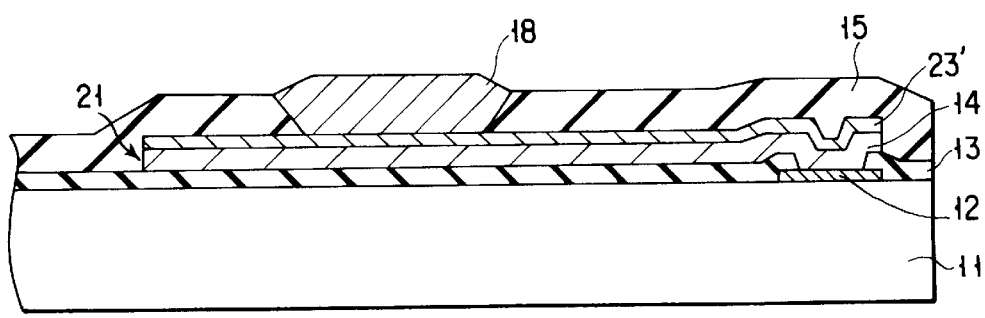
F I G. 9

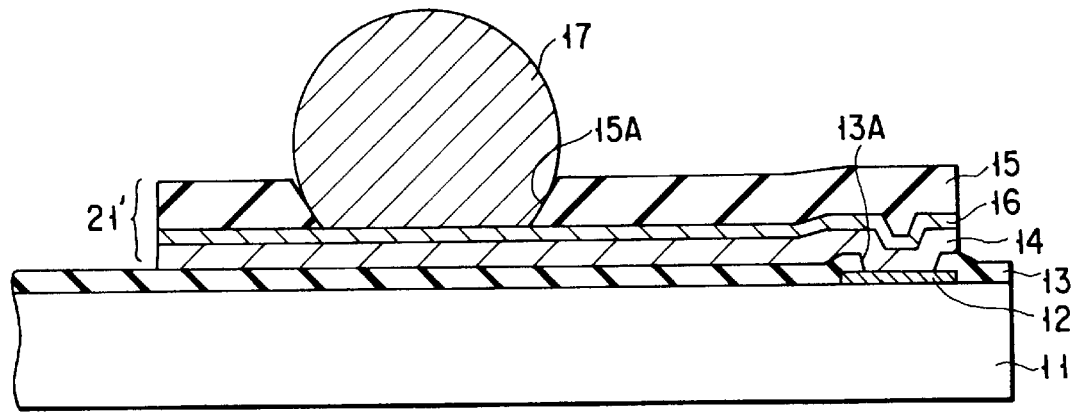
F I G. 11
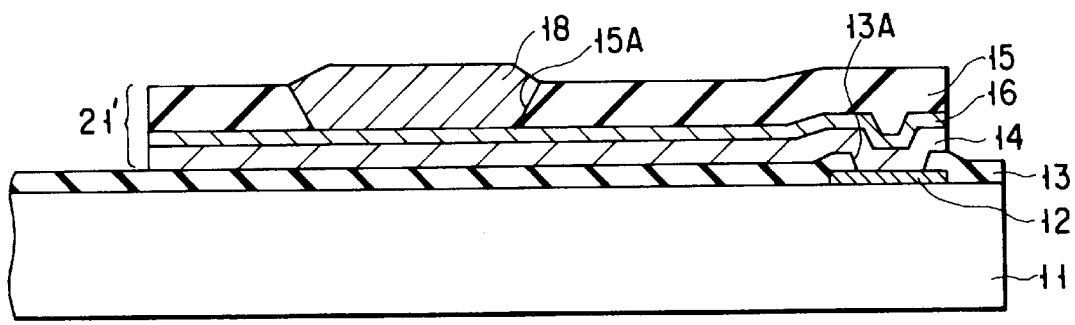
F I G. 12

FLIP-CHIP CONNECTION TYPE SEMICONDUCTOR INTEGRATED CIRCUIT DEVICE

BACKGROUND OF THE INVENTION

The present invention relates to a so-called flip-chip connection type semiconductor integrated circuit device designed such that a semiconductor integrated circuit device is directly connected to a printed circuit board through bumps, and a method of manufacturing the same.

In order to cope with current tendencies to increase the number of I/O pads of a semiconductor integrated circuit device and decrease its size, a mounting method based on a flip-chip connection method has been used, in which the I/O pads of an integrated circuit chip as a bare chip are directly and electrically connected to the corresponding pads on a printed circuit board. In the flip-chip connection method, first of all, solder projections (bumps) are formed on the respective I/O pads of a bare chip, and the bare chip is then reversed and placed above a printed circuit board such that the solder bumps are positioned with respect to the corresponding pads of the printed circuit board with a high precision. A load is imposed on the chip to temporarily mount it on the printed circuit board. Thereafter, the resultant structure is exposed to an atmosphere with a temperature higher than the melting point of the solder bumps to reflow the solder, thereby directly connecting the solder bumps to the pads. This method allows an increase in the number of I/O pads and a decrease in the pitch of the I/O pads. In addition, since the connection distance between the integrated circuit chip and the printed circuit board decreases, the integrated circuit in a mounted state is capable of a high-speed operation.

When the flip-chip connection method is to be used, since the pitch of the I/O pads of a semiconductor integrated circuit device is small (150 μm or less), pads must be formed on the printed circuit board at the same pitch as that of the pads of the integrated circuit chip with a sufficiently high precision. It is, however, difficult to form pads on a printed circuit board with a high precision. Even if a printed circuit board having pads formed with a high precision can be formed, the cost of the printed circuit board greatly increases. In addition, the small pad pitch also increases the possibility that the bumps between the adjacent pads are short-circuited.

In order to solve this problem, the following method has been proposed. An interconnection is additionally formed on an integrated circuit chip. The initial I/O pads of the integrated circuit chip and the new I/O pads are wired/connected in one-to-one correspondence. With this process, the I/O pads (solder bumps) for flip-chip connection are redistributed at positions different from those of the initial I/O pads of the integrated circuit chip.

FIG. 1 is a sectional view showing a structure near an I/O pad of a conventional flip-chip connection type semiconductor integrated circuit device whose I/O pads have undergone redistribution. A conductive layer 4, an insulating film 5, a solder ball position defining metal layer (BLM) or barrier metal layer 6, a solder bump 7, and the like are stacked on an I/O pad 2 and a passivation film 3 on an integrated circuit chip 1. The I/O pads 2 are wired/connected to the solder bumps 7 through the conductive layers 4 and the barrier metal layers 6 in one-to-one correspondence.

A flip-chip connection type semiconductor integrated circuit device having such an arrangement requires the steps of forming the conductive layer 4, the insulating film 5, the barrier metal layer 6, and the solder bump 7, respectively, resulting in an increase in manufacturing cost. When the solder bump 7 is to be formed by electroplating, the following method is often used. The barrier metal layer 6 is formed on the entire surface of the insulating film 5 to be used as a plating electrode. Thereafter, the barrier metal layer 6 is removed by etching except for a portion under the solder bump 7. In this method, the surface of the solder bump 7 is etched as well as the barrier metal layer 6 to pose a problem in connection. Alternatively, the region of the barrier metal layer 6 which is located under the solder bump 7 is side-etched. As a result, the reliability in connection between the solder bump 7 and the barrier metal layer 6 deteriorates.

BRIEF SUMMARY OF THE INVENTION

It is, therefore, an object of the present invention to provide a flip-chip connection type semiconductor integrated circuit device which can realize flip-chip connection between a bare chip and a printed circuit board at a low cost, and can prevent a connection failure between the chip and the printed circuit board.

It is another object of the present invention to provide a method of manufacturing a flip-chip connection type semiconductor integrated circuit device, which can realize flip-chip connection between a bare chip and a printed circuit board at a low cost, and can prevent a connection failure between the chip and the printed circuit board.

The first object of the present invention is achieved by a semiconductor integrated circuit device comprising an integrated circuit chip, an I/O pad formed on the integrated circuit chip, a first insulating film formed on the integrated circuit chip and the I/O pad and having a first opening portion above the I/O pad, a conductive layer formed on the first insulating film and electrically connected to the I/O pad through the first opening portion, a first barrier metal layer formed on the conductive layer, having substantially the same pattern as that of the conductive layer, and serving to prevent generation of an intermetallic compound by diffusion, a second insulating film formed on the first barrier metal layer and having a second opening portion at a position different from the first opening portion above the first barrier metal layer, and a solder bump or metal pad formed on the first barrier layer in the second opening portion, wherein a position of the solder bump or metal pad is defined by the second opening portion in the second insulating film.

According to this structure, since the I/O pads for flip-chip connection are distributed at positions different from those of the initial I/O pads of the integrated circuit, the connection pad pitch can be increased to prevent the bumps between the adjacent pads from being short-circuited. In addition, a reduction in cost of the printed circuit board can be attained. Furthermore, since the position of each solder bump or metal pad is defined by the second opening portion formed in the second insulating film instead of the solder ball position defining metal layer or barrier metal, each solder bump or metal pad can be positioned with a high precision.

The second object of the present invention is achieved by a method of manufacturing a semiconductor integrated circuit device, comprising the first step of forming an integrated circuit chip, the second step of forming an I/O pad on the integrated circuit chip, the third step of forming a first insulating film on the integrated circuit chip and the I/O pad, the fourth step of forming a first opening portion in the first insulating film at a position above the I/O pad, the fifth step of forming a conductive layer on the first insulating film and the opening portion, the sixth step of forming a first barrier metal layer on the conductive layer, the seventh step of patterning the first barrier metal layer and the conductive layer by using a single mask, the eighth step of forming a second insulating film on the first barrier metal layer and the first insulating film, the ninth step of forming a second opening portion in the second insulating film at a position different from that of the first opening portion to expose the first barrier metal layer, and the tenth step of forming a solder bump or metal pad on the first barrier metal layer in the second opening portion.

According to this manufacturing method, since the first barrier metal layer and the conductive layer are patterned by using a single mask, a reduction in cost can be attained by decreasing the number of times the PEP step is performed. In addition, since no solder bump or metal pad is formed when the first barrier metal layer is etched, there is no possibility that the solder bumps or metal pads are etched and corroded, or the barrier metal layer under each solder bump or metal pad is side-etched to degrade the reliability in connection.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 is a sectional view showing still another structure along the line 4—4 in FIG. 3;

FIG. 7 is a sectional view showing a metal pad portion, a lead interconnection portion, and an I/O pad portion to explain a flip-chip connection type semiconductor integrated circuit device according to the second embodiment of the present invention;

FIG. 8 is a sectional view showing another example of the structure in FIG. 7;

FIG. 9 is a sectional view showing still another example of the structure in FIG. 7;

FIG. 11 is a sectional view showing a solder bump portion, a lead interconnection portion, and an I/O pad portion to explain a flip-chip connection type semiconductor integrated circuit device according to the third embodiment of the present invention;

FIG. 12 is a sectional view showing a metal pad portion, a lead interconnection portion, and an I/O pad portion to explain a flip-chip connection type semiconductor integrated circuit device according to the fourth embodiment of the present invention;

DETAILED DESCRIPTION OF THE INVENTION

Figure 3:
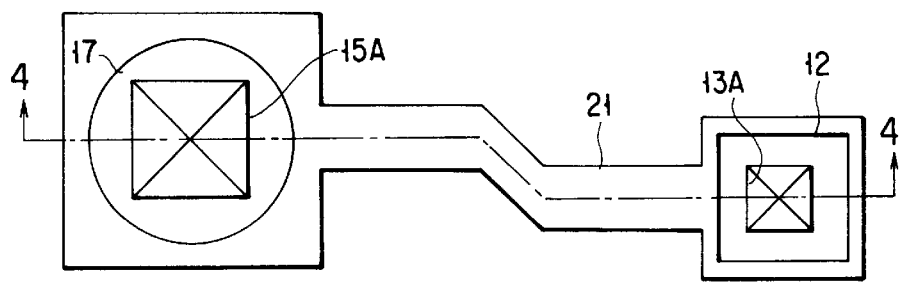
FIG. 3 is an enlarged plan view showing a solder bump portion, a lead interconnection portion, and an I/O pad portion in FIG. 2.
Figure 4:
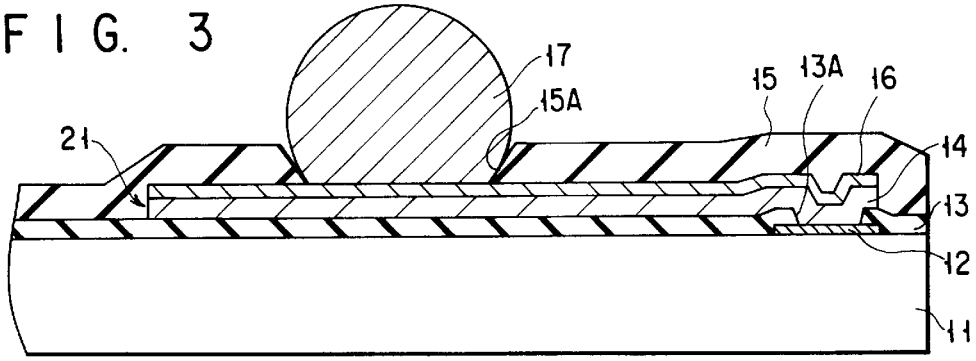
FIG. 4 is a sectional view taken along a line 4—4 in FIG. 3.
Figure 2:
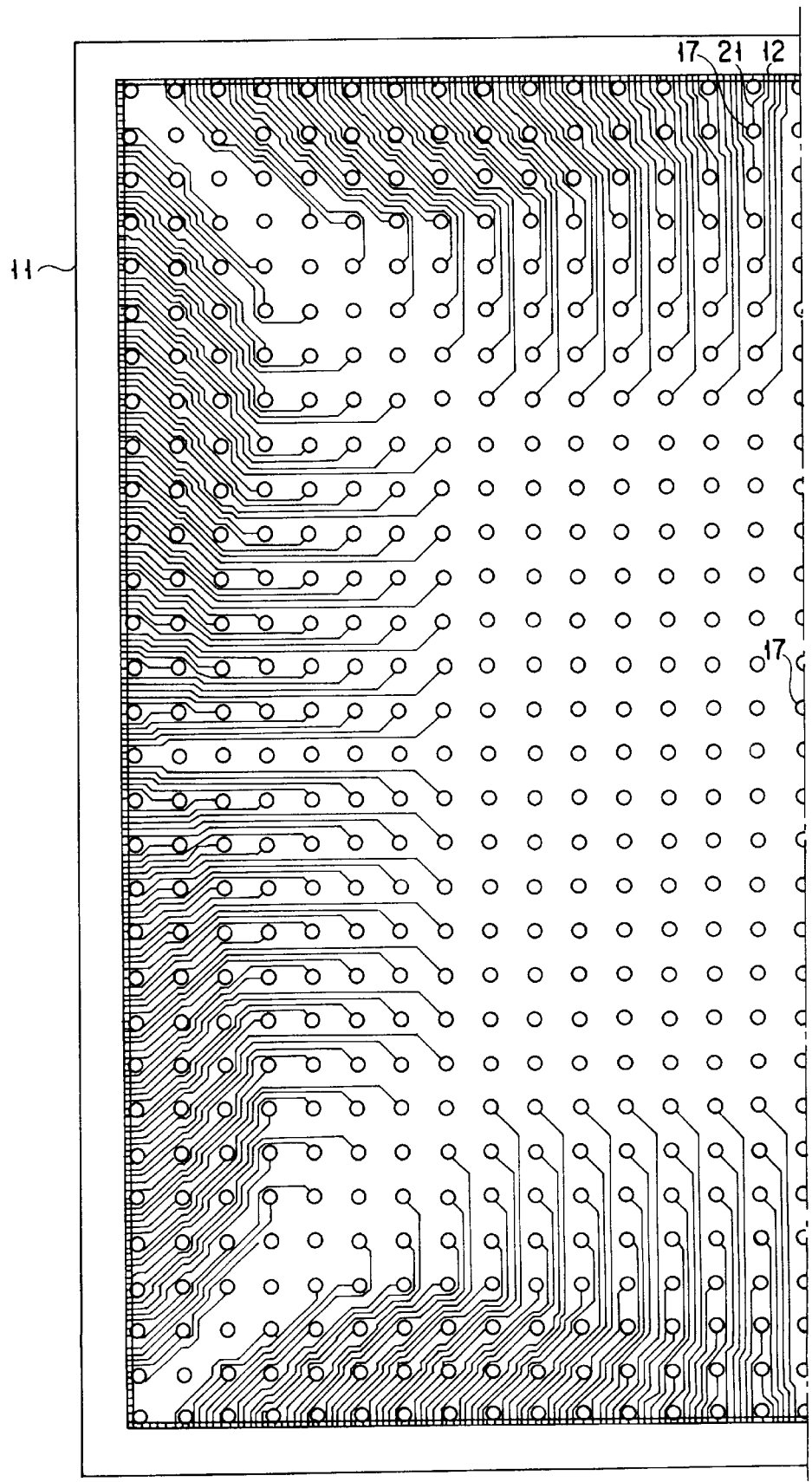
FIG. 2 is a plan view showing the solder bump formation surface of an integrated circuit chip to explain a flip-chip connection type semiconductor integrated circuit device according to the first embodiment of the present invention.

FIGS. 2 to 4 are views for explaining a flip-chip connection type semiconductor integrated circuit device according to the first embodiment of the present invention. FIG. 2 is a plan view showing the solder bump formation surface of an integrated circuit chip. FIG. 3 is an enlarged plan view showing a solder bump portion, a lead interconnection, and an I/O pad portion in FIG. 2. FIG. 4 is a sectional view taken along a line 4—4 in FIG. 3. Various types of semiconductor elements are formed in an integrated circuit chip 11 in FIG. 2. Solder bumps 17 on the peripheral portion are connected to I/O pads 12 in a one-to-one correspondence through lead interconnections 21 formed on the upper layer of the integrated circuit chip 11. The I/O pads (solder bumps 17) for flip-chip connection are redistributed at positions different from those of the initial I/O pads of the integrated circuit chip 11. Circuits susceptible to α-rays and α particles, e.g., the memory cell portions of a DRAM and dynamic circuits such as logic circuits having floating nodes, are arranged in the integrated circuit chip 11 at positions under the solder bumps 17 on the peripheral portion. The solder bumps 17 on the central portion are connected to the power supply terminals and lines of internal circuits. Power is supplied from a plurality of portions to the internal circuits through these solder bumps 17 to reduce noise.

Each solder bump portion, each lead interconnection portion, and each I/O pad portion have structures like those shown in FIGS. 3 and 4. The I/O pad 12 composed of an aluminum (Al) layer, an Al alloy layer, or the like and having a thickness of 0.8 to 1 μm is formed on the integrated circuit chip 11. A passivation film 13 composed of a silicon oxide film or silicon nitride film and having a thickness of 1 to 2 μm is formed on the integrated circuit chip 11 and the I/O pad 12. An opening portion 13A is formed in a portion of the passivation film 13 which corresponds a position above the I/O pad 12. The interconnection 21 is formed on the I/O pad 12 and the passivation film 13. The interconnection 21 is formed by stacking a conductive layer 14 and a barrier metal layer 16. The conductive layer 14 is composed of a material containing at least Al, an Al alloy, or copper (Cu) and has a thickness of 1 to 2 μm. The barrier metal layer 16 is composed of a material containing at least chromium (Cr), Cu, nickel (Ni), or titanium (Ti), has a thickness of 0.5 to 1 μm, and serves to prevent the formation of an intermetallic compound by diffusion, improve the adhesion strength, and obtain good electrical contact. The conductive layer 14 and the barrier metal layer 16 are patterned in the etching step using a single mask to have the same pattern. These layers constitute an integral structure. The I/O pads 12 and the solder bumps 17 are wired in a one-to-one correspondence through the interconnections 21. An insulating film 15 having a thickness of several μm to 20 μm is formed on the resultant semiconductor structure. As a material for the insulating film 15, a silicon oxide film, a silicon nitride film, a polyimide film, or the like is available. The insulating film 15 has an opening portion 15A at a position different from that of the opening portion 13A of the passivation film 13 described above. The solder bump 17 having a diameter of about 50 to 100 μm is formed in the opening portion 15A in contact with the exposed barrier metal layer 16. The two-dimensional position of the solder bump 17 is defined by the opening portion 15A of the insulating film 15.

According to this structure, since the I/O pads (solder bumps 17) for flip-chip connection are redistributed at positions different from those of the initial I/O pads 12 of the integrated circuit chip 11, the pitch of the solder bumps 17 can be increased to prevent short circuit between the adjacent bumps 17. In addition, since the pads on the printed circuit board are allowed to have a large pitch, and need not be formed with a high precision, a reduction in cost of the printed circuit board can be attained. Furthermore, the position of the solder bump 17 is defined by the opening portion 15A formed in the insulating film 15 instead of a solder ball position defining metal layer or the barrier metal layer 16. Therefore, the solder bump 17 can be positioned with a high precision.

Figure 5:
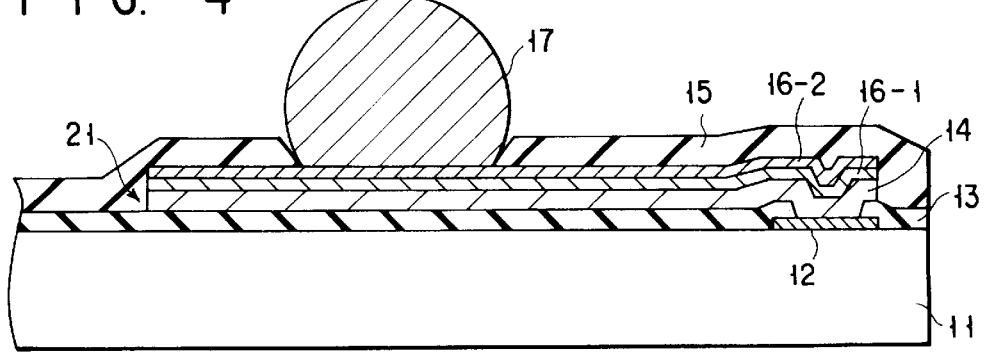
FIG. 5 is a sectional view showing another structure along the line 4—4 in FIG. 3.

In the first embodiment described above, the barrier metal layer 16 has a single-layer structure. However, the same effects as those described above can be obtained by using a barrier layer having a two-layer structure formed by stacking a metal layer 16-1 containing at least one of Cr, Cu, Ni and Ti and a metal layer 16-2 containing at least one of Pt, Au, and palladium (Pd), as shown in FIG. 5. Further, the barrier metal layer 16 having a three-or more layer structure formed by stacking the metal layers containing above materials may be used.

As shown in FIG. 6, a solder ball position defining metal layer (BLM) 23 may be formed in place of the barrier metal layer 16. As a material for the solder ball position defining metal layer 23, a metal having high solderability, e.g., Au or Pd, can be suitably used.

FIG. 7 is a sectional view for explaining a flip-chip connection type semiconductor integrated circuit device according to the second embodiment of the present invention. FIG. 7 shows a metal pad portion, a lead interconnection portion, and an I/O pad portion. This semiconductor integrated circuit device differs from the one shown in FIG. 4 in that a metal pad 18 formed by electroplating and having a thickness of 10 to 20 μm is formed as a flip-chip connection I/O pad instead of the solder bump 17. As a material for the metal pad 18, Au, Ni, Cu, or the like can be used.

As is apparent, the same effects as those of the first embodiment can be obtained by forming the metal pad 18 instead of the solder bump 17.

When the metal pad 18 is to be formed instead of the solder bump 17, a barrier metal layer may be constituted by two metal layers 16-1 and 16-2, as shown in FIG. 8.

Alternatively, as is apparent, a metal pad position defining metal layer 23' may be formed in place of the barrier metal layer, as shown in FIG. 9.

Figure 10A:
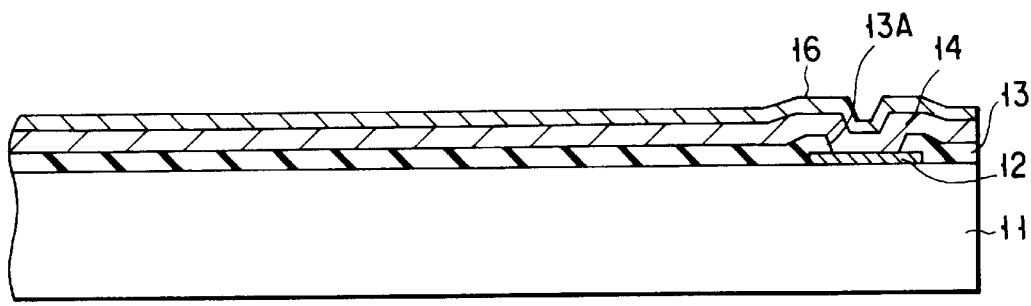
FIGS. 10A to 10C are sectional views sequentially showing the steps in manufacturing the flip-chip connection type semiconductor integrated circuit devices shown in FIGS. 4 and 7.
Figure 10B:
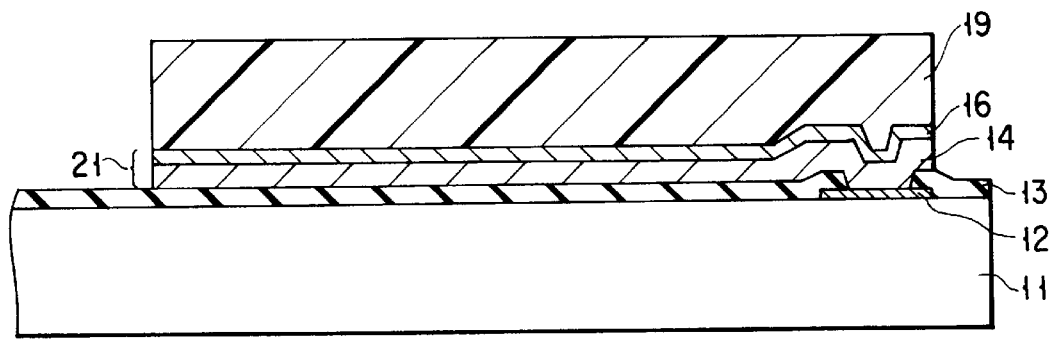
Figure 10C:
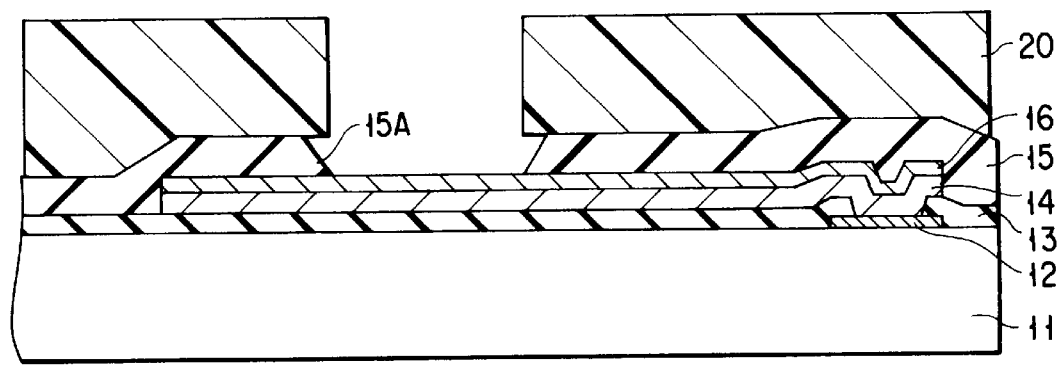

FIGS. 10A to 10C sequentially show the steps in manufacturing the flip-chip connection type semiconductor integrated circuit devices shown in FIGS. 4 and 7. First of all, various semiconductor elements and circuits (not shown) are formed in the integrated circuit chip 11 by a known manufacturing process. Thereafter, the I/O pad 12 is formed on the integrated circuit chip 11. The passivation film 13 is formed on the integrated circuit chip 11 and the I/O pad 12 by the CVD method or the like. A portion of the passivation film 13 which corresponds to a position above the I/O pad 12 is selectively wet-etched to form the opening portion 13A, thereby exposing the surface of the I/O pad 12. Subsequently, the conductive layer 14 and the barrier metal layer 16 are sequentially stacked on the I/O pad 12 and the passivation film 13 (FIG. 10A).

A photoresist 19 is coated first to the surface of the barrier metal layer 16 and then exposed and developed to form a pattern. The barrier metal layer 16 and the conductive layer 14 are etched by using the photoresist 19 as a mask to form the interconnection 21 for wiring/connecting the I/O pad 12 and the solder bump 17 in a one-to-one correspondence (FIG. 10B).

The photoresist 19 is then removed. The insulating film 15 is formed on the resultant structure by the CVD method or the like. In order to form a flip-chip connection I/O pad, a photoresist 20 is coated first to the surface of the insulating film 15 and then exposed and developed to form a pattern. The insulating film 15 is wet-etched by using the photoresist 20 as a mask to form the opening portion 15A at a position different from that of the opening portion 13A formed in the passivation film 13 (FIG. 10C).

After the photoresist 20 is removed, the solder bump 17 is formed on the exposed surface of the barrier metal layer 16 by an electroplating/reflow process, a solder ball transfer method, a screen printing method, or the like. As a result, a structure like the one shown in FIG. 4 is formed.

When the metal pad 18 as a flip-chip connection I/O pad is formed on the exposed surface of the barrier metal layer 16 by electroplating, a structure like the one shown in FIG. 7 is obtained.

Figure 1:
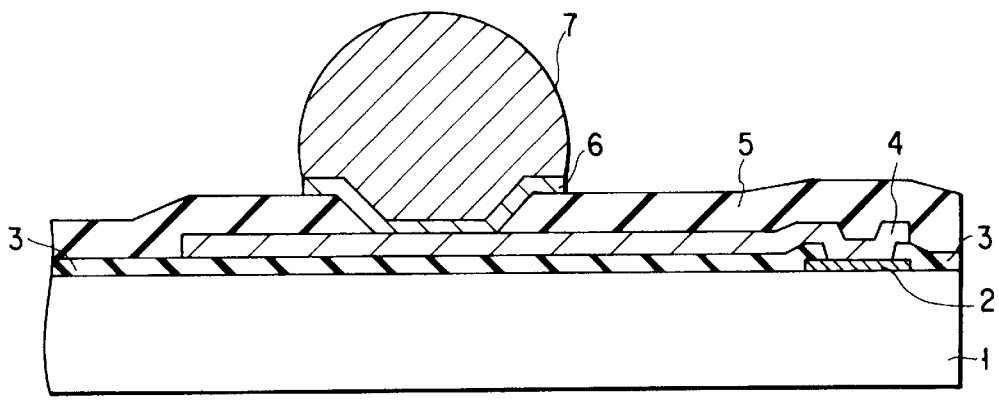
FIG. 1 is a sectional view showing a structure near an I/O pad to explain a conventional flip-chip connection type semiconductor integrated circuit device and a method of manufacturing the same.

According to the above manufacturing method, since the barrier metal layer 16 and the conductive layer 14 can be patterned in the etching step using a single mask to have the same pattern, the number of times the PEP step is performed can be decreased from three to two as compared with a case wherein the structure shown in FIG. 1 is manufactured. As a result, a reduction in cost can be attained. In addition, since the solder bump 17 or the metal pad 18 is not formed when the barrier metal layer 16 is etched, there is no possibility that the solder bump 17 or the metal pad 18 is etched and corroded, or the barrier metal layer 16 under the solder bump 17 or the metal pad 18 is side-etched to degrade the reliability in connection.

When the structure shown in FIG. 5 or 8 is to be manufactured, the first-level barrier metal layer 16-1 is formed first in the step shown in FIG. 10A, and the second-level barrier metal layer 16-2 is then stacked on the barrier metal layer 16-1. The subsequent steps are substantially the same as those shown in FIGS. 10B and 10C. If the solder bump 17 is formed after the step in FIG. 10C, the structure shown in FIG. 5 is obtained. If the metal pad 18 is formed instead of the solder bump 17, the structure shown in FIG. 8 is obtained. When the structure shown in FIG. 6 or 9 is to be formed, a solder ball position defining metal layer (BLM) 23 or a metal pad position defining metal layer 23' may be formed in place of the barrier metal layer 16 in the step shown in FIG. 10A. The subsequent manufacturing steps are the same as those shown in FIGS. 10B and 10C. If the solder bump 17 is formed after the step in FIG. 10C, the structure shown in FIG. 6 is obtained. If the metal pad 18 is formed instead of the solder bump 17, the structure shown in FIG. 9 is obtained.

FIG. 11 is a sectional view for explaining a flip-chip connection type semiconductor integrated circuit device according to the third embodiment of the present invention. FIG. 11 shows a solder bump portion, a lead interconnection portion, and an I/O pad portion. An I/O pad 12 is formed on an integrated circuit chip 11. A passivation film 13 having an opening portion 13A in a portion corresponding to a position above the I/O pad 12 is formed on the integrated circuit chip 11 and the I/O pad 12. A lead interconnection portion 21' is formed on the passivation film 13. This interconnection portion 21' is obtained by sequentially stacking a conductive layer 14, a barrier metal layer 16, and an insulating film 15. The conductive layer 14, the barrier metal layer 16, and the insulating film 15 are patterned by using a single mask to have the same pattern, and hence have an integral structure. The I/O pads 12 of the integrated circuit chip 11 are wired/connected to solder bumps 17 through the interconnection portions 21' in a one-to-one correspondence.

With this structure as well, substantially the same effects as those of the first and second embodiments can be obtained. A barrier metal layer having a two-or more layer structure may be used, as shown in FIG. 5 for example, or a solder ball position defining metal layer (BLM) 23 may be formed in place of the barrier metal layer, as shown in FIG. 6.

FIG. 12 is a sectional view for explaining a flip-chip connection type semiconductor integrated circuit device according to the fourth embodiment of the present invention. FIG. 12 shows a metal pad portion, a lead interconnection portion, and an I/O pad portion. In the fourth embodiment, a metal pad 18 is formed in place of the solder bump 17 in the third embodiment. Except for this portion, the structure shown in FIG. 12 is the same as that shown in FIG. 13. With this structure as well, substantially the same effects as those of the first to third embodiments can be obtained. A barrier metal layer having a two-or more layer structure may be used, as shown in FIG. 8 for example, or a metal pad position defining metal layer 23' may be formed in place of the barrier metal layer, as shown in FIG. 9.

Figure 13A:
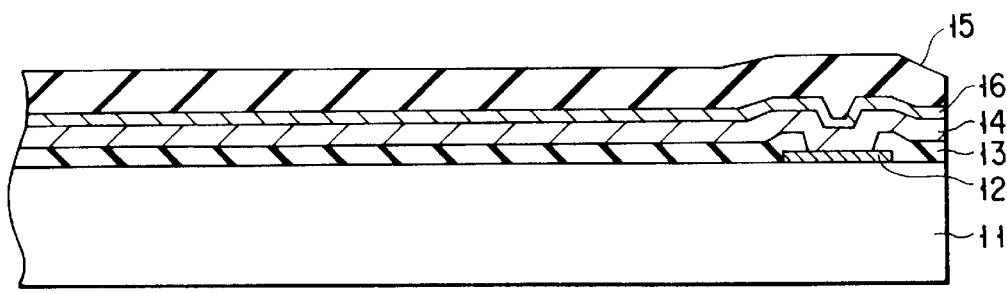
FIGS. 13A to 13D are sectional views sequentially showing the steps in manufacturing the flip-chip connection type semiconductor integrated circuit device shown in FIG. 12.

FIGS. 13A to 13D are sectional views sequentially showing manufacturing steps to explain a method of manufacturing the flip-chip connection type semiconductor integrated circuit device shown in FIGS. 11 and 12. First of all, various semiconductor elements and circuits (not shown) are formed in an integrated circuit chip 11 by a known manufacturing process, and an I/O pad 12 is then formed on the integrated circuit chip 11. A passivation film 13 is formed on the integrated circuit chip 11 and the I/O pad 12 by the CVD method or the like. An opening portion 13A is formed in a portion of the passivation film 13 which corresponds to a position above the I/O pad 12. A conductive layer 14, a barrier metal layer 16, and an insulating film 15 are sequentially stacked on the I/O pad 12 and the passivation film 13 (FIG. 13A).

Figure 13B:
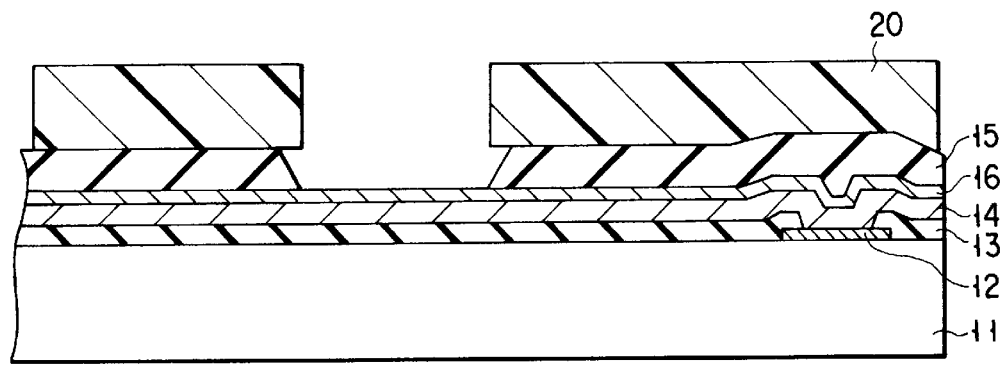

In order to form and redistribute a flip-chip connection I/O pad, a photoresist 20 is patterned by PEP, and the insulating film 15 is etched by using the photoresist 20 as a mask, thereby forming an opening portion 15A for defining the position of a flip-chip connection metal pad at a position different form that of the opening portion 13A formed in the passivation film 13 (FIG. 13B).

Figure 13C:
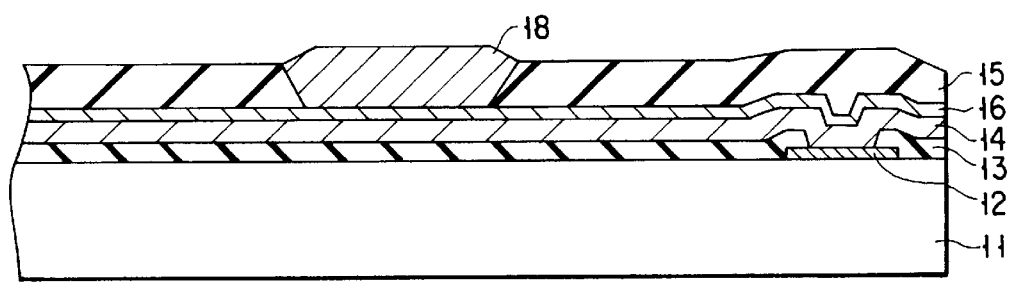

Subsequently, the photoresist 20 is removed, and a metal pad 18 is formed by electroplating (FIG. 13C). In this case, the conductive layer 14 and the barrier metal layer 16 are formed on the entire surface of the integrated circuit chip 11 so that the multilayer structure constituted by the conductive layer 14 and the barrier metal layer 16 can be used as an electrode for electroplating. Electroplating can therefore be performed stably.

Figure 13D:
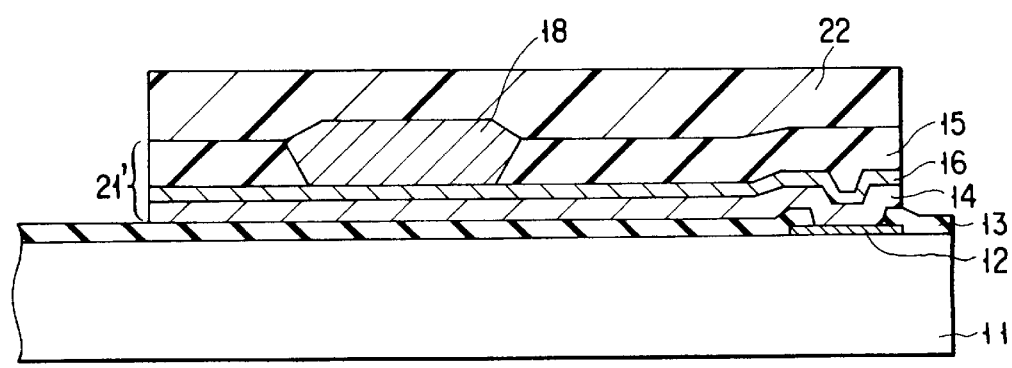

A photoresist 22 is patterned by PEP, and etching is performed by using the photoresist 22 as a mask, thereby forming an interconnection portion 21' for wiring/connecting the I/O pad 12 of the integrated circuit chip 11 to the metal pad 18 in a one-to-one correspondence (FIG. 13D). When the photoresist 22 is removed, the structure shown in FIG. 12 is obtained.

If a solder bump 17 is formed by an electroplating/reflow process, a solder ball transfer method, a screen printing method, or the like instead of the flip-chip connection metal pad 18 in the step shown in FIG. 13C, the structure shown in FIG. 11 can be formed.

According to this manufacturing method, since the number of times the PEP step is performed can be decreased from three to two, the number of steps is smaller than that in the conventional manufacturing step, allowing a reduction in cost. In addition, when the barrier metal layer 16 is etched, there is no possibility that the solder bump 17 or the metal pad 18 is etched and corroded, or the barrier metal layer 16 under the solder bump 17 or the metal pad 18 is side-etched to degrade the reliability. Furthermore, since the position of the solder bump 17 is defined by the opening portion 15A formed in the insulating film 15 instead of a solder ball position defining metal layer or a barrier metal layer as in the conventional method, high-precision positioning can be performed.

As is apparent, in the structure shown in FIG. 11, a barrier metal having a two-or more layer structure may be formed, as shown in FIG. 5 for example, or a solder ball position defining metal layer 23 may be formed in place of the barrier metal layer, as shown in FIG. 6. Similarly, in the structure shown in FIG. 12, a barrier metal layer having a two-layer structure may be formed, as shown in FIG. 8, or a metal pad position defining metal layer 23' may be formed in place of the barrier metal layer, as shown in FIG. 9.

Figure 14:
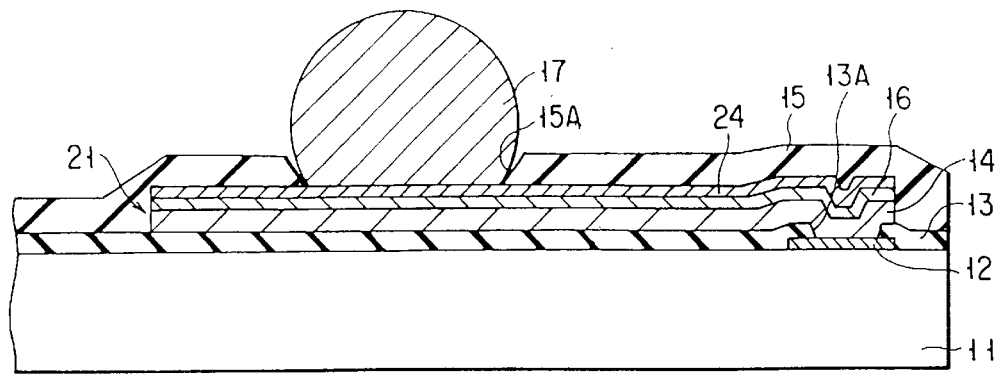
FIGS. 14 to 17 are sectional views each showing a solder bump portion, a lead interconnection portion, and an I/O pad portion to explain the flip-chip connection type semiconductor integrated circuit device according to the fourth embodiment of the present invention.
Figure 15:
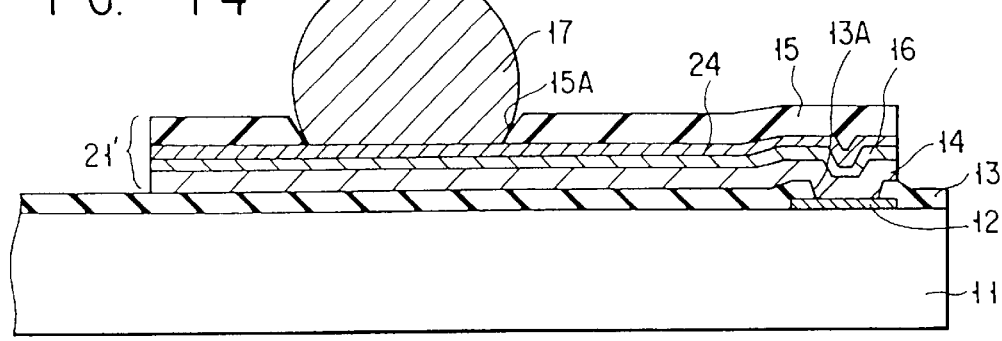
Figure 16:
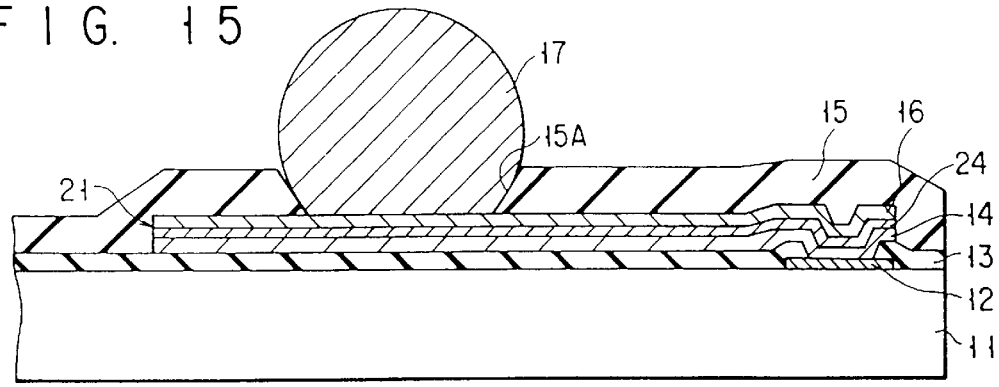
Figure 17:
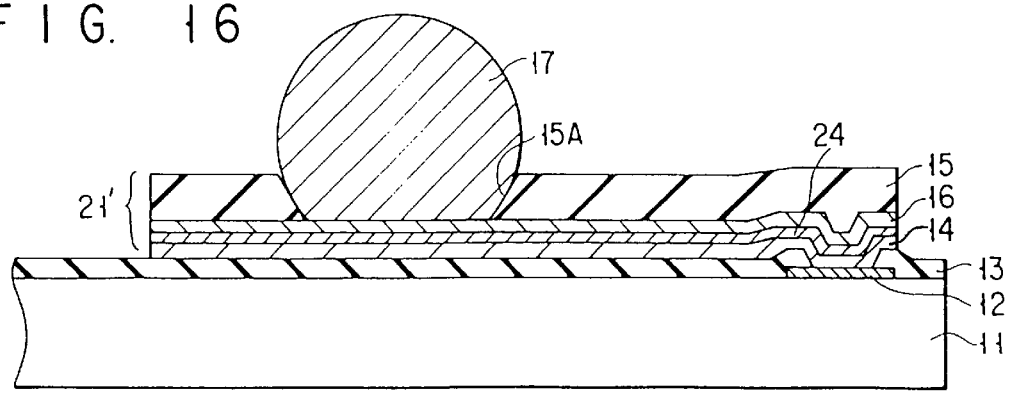

FIGS. 14 to 17 are sectional views for explaining a flip-chip connection type semiconductor integrated circuit device according to the fourth embodiment of the present invention. In the structure shown in FIG. 14, a barrier metal layer 24 is formed on the barrier metal layer 16 in FIG. 4 to prevent α particles and α-rays in the solder bump 17 from reaching the semiconductor elements in the integrated circuit chip 11. In the structure shown in FIG. 15, a barrier metal layer 24 is formed on the barrier metal layer 16 in FIG. 11 to prevent α particles and α-rays in the solder bump 17 from reaching the semiconductor elements in the integrated circuit chip 11. In the structure shown in FIG. 16, the barrier metal layer 24 in FIG. 14 is interposed between the conductive layer 14 and the barrier metal layer 16. Similarly, in the structure shown in FIG. 17, the barrier metal layer 24 in FIG. 15 is interposed between the conductive layer 14 and the barrier metal layer 16.

As a material for the barrier metal layer 24, a heavy metal such as Au or platinum (Pt) is preferably used.

According to these structures, the barrier metal layer 24 prevents α particles and α-rays in the solder bump 17 from reaching the semiconductor elements in the integrated circuit chip 11. If, therefore, circuits susceptible to α-rays and α particles, e.g., the memory cell portions of a DRAM and dynamic circuits such as logic circuits having floating nodes, are arranged in the integrated circuit chip 11 at positions under these interconnection portions 21 or 21', the influences of α-rays and α particles from the solder bumps 17 can be suppressed.

Note that one of the structures shown in FIGS. 14, 15, 16, and 17 may be selected in consideration of materials for the barrier metal layers 16 and 24, the solderability of these materials, the adhesion strength with respect to the solder bumps, the electrical contact characteristics, and the like.

As has been described above, according to the present invention, there are provided a flip-chip connection type semiconductor integrated circuit device and a method of manufacturing the same, which can realize flip-chip connection between a bare chip and a printed circuit board at a low cost, and can prevent a connection failure between the chip and the printed circuit board.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
   an integrated circuit chip;
   an I/O pad formed on said integrated circuit chip;
   a first insulating film formed on said integrated circuit chip and said I/O pad and having a first opening portion above said I/O pad;
   a conductive layer formed on said first insulating film and electrically connected to said I/O pad through the first opening portion;
   a first barrier metal layer formed on said conductive layer, having substantially the same pattern as that of said conductive layer, and serving to prevent generation of an intermetallic compound by diffusion;
   a second insulating film formed on said first barrier metal layer, having a planar top surface, and having a second opening portion at a position different from the first opening portion and above said first barrier metal layer;
   a solder bump formed on said first barrier layer in the second opening portion and not extending onto the planar top surface of the second insulating film,
   wherein a position of said solder bump is defined by the second opening portion in said second insulating film, and
   a second barrier metal layer interposed between said solder bump and said first barrier metal layer to prevent α particles in said solder bump from entering said integrated circuit chip.

2. A device according to claim 1, wherein said conductive layer is composed of at least one material selected from the group consisting of Al, an Al alloy, and Cu.

3. A device according to claim 1, wherein said first barrier layer is composed of at least one material selected from the group consisting of Cr, Cu, Ni, and Ti.

4. A device according to claim 1, wherein said second insulating film is extended from said first barrier metal layer onto said first insulating film.

5. A device according to claim 1, wherein each of said first and second insulating films is a film selected from the group consisting of a silicon oxide film, a silicon nitride film, and a polyimide film.

6. A device according to claim 1, wherein said second barrier metal layer is composed of at least one material selected from the group consisting of Au and Pt.

7. A device according to claim 1, further comprising a dynamic circuit provided below said second barrier metal layer.

8. A semiconductor integrated circuit device comprising:
   an integrated circuit chip;
   an I/O pad formed on said integrated circuit chip;
   a first insulating film formed on said integrated circuit chip and said I/O pad and having a first opening portion above said I/O pad;
   a conductive layer formed on said first insulating film and electrically connected to said I/O pad through the first opening portion, wherein the conductive layer is formed of a first material;
   a solder ball position defining metal layer formed on said conductive layer and having substantially the same pattern as that of said conductive layer, wherein the solder ball position defining metal layer is formed of a second material different than the first material;
   a second insulating film formed on said solder ball position defining metal layer, having a planar top surface, and having a second opening portion at a position different from that of the first opening portion and above said solder ball position defining metal layer;
   a solder bump formed on said solder ball position defining metal layer in the second opening portion and not extending onto the planar top surface of the second insulating film,
   wherein a position of said solder bump is defining by the second opening portion in said second insulating film; and
   a barrier metal layer interposed between said solder bump and said solder ball position defining metal layer to prevent α particles in said solder bump from entering said integrated circuit chip.

9. A device according to claim 8, wherein said conductive layer is composed of at least one material selected from the group consisting of Al, an Al alloy, and Cu.

10. A device according to claim 8, wherein said solder ball position defining metal layer is composed of at least one material selected from the group consisting of Au and Pd.

11. A device according to claim 8, wherein said second insulating film is extended from said solder ball position defining metal layer onto said first insulating film.

12. A device according to claim 8, wherein each of said first and second insulating films is a film selected from the group consisting of a silicon oxide film, a silicon nitride film, and a polyimide film.

13. A device according to claim 8, wherein said barrier metal layer is composed of at least one material selected from the group consisting of Au Pt.

14. A device according to claim 8, further comprising a dynamic circuit provided below said barrier metal layer.

15. A semiconductor integrated circuit device comprising:
   an integrated circuit chip;
   an I/O pad formed on said integrated circuit chip;
   a first insulating film formed on said integrated circuit chip and said I/O pad and having a first opening portion above said I/O pad;

a conductive layer formed on said first insulating film and electrically connected to said I/O pad through the first opening portion;

a first barrier metal layer formed on said conductive layer, having substantially the same pattern as that of said conductive layer, and serving to prevent generation of an intermetallic compound by diffusion;

a second insulating film formed on said first barrier metal layer, having a planar top surface, and having a second opening portion at a position different from the first opening portion and above said first barrier metal layer;

a solder bump formed on said first barrier layer in the second opening portion and not extending onto the planar top surface of the second insulating film, wherein a position of said solder bump is defined by the second opening a portion in said second insulating film; and a second barrier metal layer interposed between said first barrier metal layer and said conductive layer to prevent a particles in said solder bump from entering said integrated circuit chip.

16. A semiconductor integrated circuit device comprising:

an integrated circuit chip;

an I/O pad formed on said integrated circuit chip;

a first insulating film formed on said integrated circuit chip and said I/O pad and having a first opening portion above said I/O pad;

a conductive layer formed on said first insulating film and electrically connected to said I/O pad through the first opening portion, wherein the conductive layer is formed of a first material;

a solder ball position defining metal layer formed on said conductive layer and having substantially the same pattern as that of said conductive layer, wherein the solder ball position defining metal layer is formed of a second material different than the first material;

a second insulating film formed on said solder ball position defining metal layer, having a planar top surface, and having a second opening portion at a position different from that of the first opening portion and above said solder ball position defining metal layer;

a solder bump formed on said solder ball position defining metal layer in the second opening portion and not extending onto the planar top surface of the second insulating film, wherein a position of said solder bump is defining by the second opening portion in said second insulating film; and a barrier metal layer interposed between said solder ball position defining metal layer and said conductive layer to prevent a particles in said solder bump from entering said integrated circuit chip.

* * * * *

UNITED STATES PATENT AND TRADEMARK OFFICE
CERTIFICATE OF CORRECTION

PATENT NO. : 6,111,317
DATED : August 29, 2000
INVENTOR(S) : Takashi OKADA et al.

Page 1 of 1

It is certified that error appears in the above-identified patent and that said Letters Patent is hereby corrected as shown below:

Claim 1, col. 9, line 53, "film," should read --film;--.
Claim 8, col. 10, line 36, "is defining" should read --is defined--.
Claim 8, col. 10, line 41, "a particles" should read --$\alpha$ particles--.
Claim 13, col. 10, line 58, "Au Pt" should read --Au and Pt--.
Claim 15, col. 11, line 17, after "second opening", delete "a".
Claim 15, col. 11, line 21, "a particles" should read --$\alpha$ particles--.
Claim 16, col. 12, line 20, "is defining" should read --is defined--.
Claim 16, col. 12, line 25, "a particles" should read --$\alpha$ particles--.

Signed and Sealed this

Fifth Day of June, 2001

*Attest:*

*Nicholas P. Godici*

NICHOLAS P. GODICI

*Attesting Officer*

*Acting Director of the United States Patent and Trademark Office*